(12) United States Patent  (10) Patent No.: US 7,757,135 B2
Nadeau-Dostie et al.  (45) Date of Patent: Jul. 13, 2010

(54) METHOD AND APPARATUS FOR STORING AND DISTRIBUTING MEMORY REPAIR INFORMATION

(75) Inventors: Benoit Nadeau-Dostie, Ottawa (CA); Jean-François Coté, Chelsea (CA)

(73) Assignee: Mentor Graphics Corporation, Wilsonville, OR (US)

( * ) Notice: Subject to any disclaimer, the term of this patent is extended or adjusted under 35 U.S.C. 154(b) by 166 days.

(21) Appl. No.: 11/853,383

(22) Filed: Sep. 11, 2007

(65) Prior Publication Data

US 2008/0065929 A1 Mar. 13, 2008

Related U.S. Application Data

(60) Provisional application No. 60/825,185, filed on Sep. 11, 2006.

(51) Int. Cl.
G11C 29/00 (2006.01)
G01R 31/28 (2006.01)

(52) U.S. Cl. .................... 714/723; 714/711; 714/733

(58) Field of Classification Search .............. 714/710, 714/711, 718, 723, 733
See application file for complete search history.

(56) References Cited

U.S. PATENT DOCUMENTS

| 6,363,020 | B1 | 3/2002 | Shubat et al. |
|---|---|---|---|
| 6,556,490 | B2 | 4/2003 | Shubat et al. |
| 6,577,156 | B2 * | 6/2003 | Anand et al. ............... 326/37 |
| 6,738,938 | B2 | 5/2004 | Nadeau-Dostie et al. |
| 6,898,143 | B2 | 5/2005 | Puri et al. |
| 7,290,186 | B1 * | 10/2007 | Zorian et al. ............. 714/718 |
| 7,310,278 | B2 * | 12/2007 | Bright et al. ............. 365/200 |
| 2003/0117829 | A1 * | 6/2003 | Ronza et al. ............. 365/96 |
| 2003/0196143 | A1 | 10/2003 | Puri et al. |
| 2005/0132255 | A1 | 6/2005 | Tran et al. |
| 2006/0031726 | A1 | 2/2006 | Zappa et al. |
| 2006/0053361 | A1 * | 3/2006 | Kim ......................... 714/766 |
| 2007/0036011 | A1 * | 2/2007 | Dubey ..................... 365/200 |
| 2007/0047343 | A1 | 3/2007 | Adams et al. |

* cited by examiner

Primary Examiner—James C Kerveros
(74) Attorney, Agent, or Firm—Ridout & Maybee LLP

(57) ABSTRACT

A system for repairing embedded memories on an integrated circuit includes an external Built-In Self-repair Register (BISR) associated with every reparable memory. Each BISR is serially configured in a daisy chain with a fuse box controller. The controller determines the daisy chain length upon power up. The controller may perform a corresponding number of shift operations to move repair data between BISRs and a fuse box. Memories can have a parallel or serial repair interface. The BISRs may have a repair analysis facility into which fuse data may be dumped and uploaded to the fuse box or downloaded to repair the memory. Pre-designed circuit blocks provide daisy chain inputs and access ports to effect the system or to bypass the circuit block.

23 Claims, 9 Drawing Sheets

METHOD AND APPARATUS FOR STORING AND DISTRIBUTING MEMORY REPAIR INFORMATION

RELATED APPLICATIONS

The present invention claims priority from U.S. provisional Patent Application No. 60/825,185, which is incorporated herein by reference.

FIELD OF THE INVENTION

The present invention relates to integrated circuits, and more particularly to an innovative system for storing and distributing memory repair information on an integrated circuit.

BACKGROUND OF THE INVENTION

Integrated circuits may contain tens or even hundreds of embedded memories in conjunction with other circuitry. During the manufacturing process, one or more of such memories will exhibit failures that may adversely impact the ability of the integrated circuit housing them to operate in its intended manner.

In order to increase yields of such integrated circuits, a large plurality of which may be found on a single integrated circuit wafer, a number memory repair techniques have been developed.

Typically such techniques involve designing within each memory circuit, a plurality of redundant memory circuits, whether in the form of additional columns, rows or locations, which can be dynamically substituted for locations within the memory which have been a priori diagnosed (during a testing phase of the integrated circuit manufacturing process) as exhibiting failure characteristics.

Then, when the integrated circuit is installed and powered up, information is conveyed to the memory, at the time of start up, instructing it to access a location within the redundant memory whenever a failed memory location is actually sought to be accessed. In this fashion, so long as a properly functioning redundant memory location may be accessed as a proxy for any failed memory locations within the memory, the memory may be said to be repaired and available for use within the integrated circuit, with the consequence that in the absence of other non-reparable errors within the integrated circuit, the integrated circuit will operate in its intended fashion.

Initial attempts at memory repair were made on an individual memory basis, as shown in prior art FIG. 1. The memory 100 comprises both conventionally addressable locations (not shown) as well as at least one bank of redundant memory locations (not shown), which may be configured as one or more columns or rows commensurate in dimension with a corresponding column or row of the addressable locations, or as one or more discrete memory locations.

In addition to conventional bus signals (not shown), including address and data lines, memory 100 comprises repair inputs comprising at least one repair address bus 110 and a repair enable control line 111 corresponding thereto. The repair address bus 110 has a number of signal lines corresponding to the number of bits used to address the bank of redundant memory locations, whether configured as a column, row or as a discrete memory location or word. For example, it is common to replace all columns associated with a memory data input/output port if any of the columns is defective. In such case, the repair address bus 110 may be configured simply to designate the number associated with the particular memory data input/output port in issue.

In some implementations, the repair address bus 110 and the repair enable control line 111 may be encoded in a common signal for convenience.

In order to repair one or more conventionally addressable locations of the memory 100, the corresponding address of the addressable memory segment or location, for which the redundant bank of memory locations is to be substituted, is presented at the repair address bus 110 and the repair enable control line 111 is configured to indicate that a repair is to be effected. The addressable location data is preferably stored in a non-volatile memory or register but in any event serves to alert an associated memory controller to access the corresponding redundant data location or segment when and if access to a location addressed by the addressable location data is attempted.

While preferably, the repair address bus 110 is otherwise held at an initialized value, such as all 0s, typically, memory repair systems such as the one described will ignore any value presented at the repair address bus 110 unless the repair enable control line 111 indicates that a repair should be effected.

In a memory repair system, there may only be one redundant location or segment available for use, in which presenting the address of the addressable location or segment to be repaired at the repair address bus 110 may be sufficient. Those having ordinary skill in this art will appreciate that where a plurality of such redundant locations and/or segments are available, the repair address bus 110 may contain a plurality of pairs of repair address and repair enable inputs. Alternatively, in addition to data lines to present the address of the addressable memory location or segment to be repaired, the repair address bus 110 may comprise a plurality of address lines to access one of a plurality of registers or memories in which the data, consisting of the address information and the corresponding repair enable input, may be stored, corresponding to one of a plurality of redundant locations or segments.

Such parallel repair interfaces, in which the repair information is applied directly to the memory input, are suitable where repair information is local to the particular memory being serviced.

However, there have been a number of attempts at developing a centralized memory repair system, in part because generally only a small subset of a memory and only a small number of memories (on the order of 10) located on an integrated circuit will fail. Centralizing the repair information may permit considerable compression, on the order of 10 to 1 or even more, of the silicon resources dedicated to repair functions.

Typically, and for the purposes of the present discussion, the centralized location is denoted a fuse box and the individual repair information data contained therein are denoted as fuses. Historically, this comes from the name of some of the common types of non-volatile memory used to implement the fuse box, namely laser fuse or e-fuse memory. Those having ordinary skill in this art will appreciate that other types of non-volatile memory, including but not limited to flash memory may also be appropriate to implement the fuse box.

In conjunction therewith, it has been found that a serial repair interface, such as is shown in prior art FIG. 2, may be more practical, inasmuch as a serial transfer approach minimizes the integrated circuit real estate that may be otherwise dedicated to distribution of repair information.

Additionally, the serial transfer approach permits a uniform interface for repair inputs, irrespective of the length (and concomitant number of data lines) of the address bus for addressing locations for repair or the number of redundant segments or locations housed thereon. As may be appreciated, the particular configuration of both addressable and redundant memory within a given memory circuit will impact on the number of address and data lines to be presented to it as repair inputs.

Furthermore, circuit design methodologies have tended to favour the use of pre-designed circuit blocks for modular insertion into integrated circuit designs. Implementing centralized repair strategies on circuits making use of such pre-designed circuit blocks is facilitated by the uniform interface provided by such serial transfer approaches.

In memories having serial repair inputs, such as memory 200, an internal register (in addition to such register or memory for storing the address(es) of the addressable location(s)) or Built-In Self-Repair (BISR) register 220, which may be a shift register, may be provided on chip. Such BISR 220 may accept as inputs a serial input line 221, a repair reset line 222 and a repair clock signal 223, and generate a serial output line 224. The serial input line 221 transmits both data on addressable location(s) for repair and a repair enable signal corresponding thereto from the centralized fuse box. This serial data is clocked into the memory 200 and into the BISR 220 by the repair clock signal 223, which is centrally generated. The repair reset signal 222 may be used to initialize the BISR 220 prior to clocking in repair data.

Once the repair data comprising an addressable location and enable pair is received by the BISR 220, this information may be presented and preferably stored in a register or memory location to the memory controller to effect the repair as discussed above along a repair address bus 210 and a repair enable control line 211 comparable to their counterparts shown in FIG. 1.

Preferably, the BISR 220 presents its contents as a serially clocked output along serial output line 224. This permits the functionality of the BISR 220 to be tested and/or monitored. Additionally, this permits the establishment of a "daisy-chain" of serial lines from successive memories on the integrated circuit so that a single set of serial data and clocking lines may emanate from the fuse box for the purpose of effecting memory repairs.

The art is replete with examples of centralized fuse box approaches to memory repair systems. An early example is disclosed in U.S. Pat. Nos. 6,363,020 and 6,556,490, respectively entitled "Architecture with multi-instance redundancy implementation" and "System and method for redundancy implementation in a semiconductor device" and issued Mar. 26, 2002 and Apr. 29, 2003 respectively to Shubat et al, which discloses a fuse box to provide fuses to each memory in a memory architecture having redundancy. A fuse box register is provided outside a memory macro and serves an arbitrary number of memories connected in a daisy chain. The fuse box register contains a plurality of fuses used for storing locations of defective rows and columns of a main memory array so that during power-up or after blowing the fuses, the fuse data is transferred to a plurality of volatile redundancy scan flip-flops, connected in a scan chain, both in the fuse box register as well as within the respective memories. This permits the fuse box register to be thereafter deactivated in order to eliminate quiescent current through the fuses, resulting in considerable power savings. During operation, the fuse contents are scanned into individual flip-flops organized as volatile scan registers of the memory instances. The redundant elements may be pre-tested in an override mode by bypassing the fuses and directly scanning arbitrary patterns into the redundancy scan flip-flops.

The Shubat et al systems do not perform any compression of the fuse data, but rather make use of memory-specific information, in which the number of fuses and redundancy flip-flops in the fuse box register and containing the fuse data exactly match the number and configuration of the redundancy flip-flops in the memory instances. Moreover, they are unable to support memories incorporating a mixture of parallel and serial repair approaches. Further, during testing of a plurality of integrated circuits on a single wafer to identify faults in the memories embedded therein, a considerable amount of information may be delivered to the tester in parallel causing a processing overload.

United States Patent Application No. 2007/0046343 entitled "Automation of fuse compression for an ASIC design system" filed by Adams et al and published Mar. 1, 2007 discloses a method and system for repairing defective memory in a semiconductor chip having memory locations, redundant memory and a central location for ordered fuses. The ordered fuses identify, in compressed format, defective sections of the memory locations for replacement by sections of the redundant memory. The ordered fuses have an associated fuse bit pattern which sequentially represents the defective sections in compressed format. The memory locations are wired together in order and a shift register of latches is provided through the memory locations corresponding to the identified order. Each of the latches is associated with a corresponding bit of an uncompressed bit pattern, comprising a sequence of bits representing the defective sections in uncompressed format, from which the fuse bit pattern is derived. While Adams et at provides an on-chip controller to reduce the amount of information presented to an off-chip tester during a testing phase and introduces a fuse data compression scheme, the disclosed system remains specific to the number, size and configuration of the embedded memory locations and incapable of supporting memories incorporating a mixture of parallel and serial repair approaches.

U.S. Pat. No. 6,898,143 entitled "Sharing fuse blocks between memories in hard-BISR" and issued "May 24, 2005" to Puri et al ("Puri1") discloses a Built-In Self-Repair (BISR) scheme in which a plurality of memories are serially connected to a fuse controller. A plurality of fuse blocks corresponding thereto is also serially connected to the fuse controller. The number of fuse blocks is less than the number of memories and the fuse controller is configured so that memories may share the fuse blocks to reduce cost. Preferably, each fuse block includes fuse elements which can be programmed with an instance number of a memory for repair. The fuse block reduces routing congestion and is preferably configured to flexibly assign any fuse block to any memory for repair. The programmable fuse elements are preferably loaded into a counter forming part of the fuse controller, which ensures that correct block information is loaded into the corresponding memory instance. While Puri1 discloses a fuse data compression scheme, the disclosed system remains specific to the number, size and configuration of the embedded memory locations and incapable of supporting memories incorporating a mixture of parallel and serial repair approaches. Further, it provides no relief to an off-chip tester from information overload during a testing phase.

In United States Patent Application No. 2003/0196143 entitled "Power-on state machine implementation with a counter to control the scan for products with hard-BISR memories" filed by Puri et al and published Oct. 16, 2003 ("Puri2"), there is disclosed a controller circuit configured to present one or more control signals to control one or more Built-In Self-Test (BIST) and Built-In Self-Repair (BISR) modes of operation. The disclosed BISR assembly circuit generally comprises one or more memory blocks each comprising a counter configured to generate a clock cycle count value in response to a repair solution. The memory blocks may be remapped in response to the count values during one or more of the BISR operations. While Puri2 incorporates a central/shared fuse box concept, it does not disclose a fuse data compression scheme, the disclosed system remains specific to the number, size and configuration of the embedded memory locations and incapable of supporting memories incorporating a mixture of parallel and serial repair approaches and provides no relief to an off-chip tester from information overload during a testing phase.

In United States Patent Application No. 2005/0132255 entitled "Low-power SRAM E-fuse repair methodology" filed by Tran et al and published Jun. 16, 2005, a method is provided for substantially removing system latency during memory and/or E-fuse farm module power-down in a device that employs E-fuse farm technology. While Tran et al use a shared fuse box architecture, they do not disclose a fuse data compression scheme, the disclosed system remains specific to the number, size and configuration of the embedded memory locations and incapable of supporting memories incorporating a mixture of parallel and serial repair approaches and provides no relief to an off-chip tester from information overload during a testing phase.

In United States Patent Application No. 2006/0031726 entitled "Programmable multi-mode Built-In Self-Test and Self-Repair structure for embedded memory arrays" filed by Zappa et al and published Feb. 9, 2006, a non-volatile (flash) memory and BIST circuitry are shared among several memories. Repair solutions for each memory are stored in a redundancy register of the BISR architecture without immediately storing them in a non-volatile memory array of the device until substitution of all of the faulty addresses by the use of the designated redundancy structures has been verified in order to save test time. Nevertheless, Zappa et al do not disclose a fuse data compression scheme and the disclosed system remains specific to the number, size and configuration of the embedded memory locations and incapable of supporting memories incorporating a mixture of parallel and serial repair approaches and provides no relief to an off-chip tester from information overload during a testing phase.

Accordingly, it is desirable to provide a novel and improved memory repair system that is centralized for an integrated circuit that is independent of the particular number, size and configuration of the embedded memories thereon and accommodates both parallel and serial repair approaches and use of pre-designed circuit blocks.

It is further desirable to provide a novel and improved memory repair system that permits not only download of fuse data from the central fuse box to the various memories during the start-up phase of the integrated circuit, but also facilitates the upload of fuse data into the fuse box and its verification during a testing phase of the manufacture of the integrated circuit.

It is still further desirable to provide a novel and improved memory repair system that reduces the amount of information presented to an off-chip tester during a testing phase and minimizes the amount of resources used to provide this capability.

SUMMARY OF THE INVENTION

The present invention accomplishes the foregoing by providing a serially clocked, closed loop daisy chain memory repair system comprising a central fuse box, a fuse box interface, a fuse box controller and a plurality of BISR registers connected to memory repair inputs.

The central fuse box stores in a non-volatile memory, memory repair data and optionally parametric non-repair data such as control memory timing, pre-emphasis and pad slew rate related to individual instances of the memories and I/O pad drivers of the integrated circuit, for distribution among the various memories. Preferably, the memory repair and non-repair data is stored in a high order compression scheme.

The fuse box interface facilitates the integration of different non-volatile memories as fuse boxes while presenting a fixed interface to the fuse box controller.

The fuse box controller contains no memory-specific information. Rather it self-discovers the length of the chain formed by the BISR registers, rendering it insensitive to the number, size and configuration of embedded memories and easily accommodating last-minute design changes to the number of memories, their order in the repair chain and their hierarchical order, if any, as a (nested) component of a pre-designed circuit block.

Advantageously, the chain may be terminated at primary inputs to each block facilitating their addition to a higher level chain. Alternatively, chain segments contained in a pre-designed circuit block may be bypassed to simplify design verification.

Further, the fuse box controller may implement a high order compression scheme to reduce the size of the central fuse box. The presence of the fuse box controller may obviate the communication of considerable amounts of repair data to an off-chip tester during a testing phase and processing of this data by the tester, in the form of compression and/or writing of repair information to the fuse box, which would otherwise be the case in its absence.

Repair data may be circulated along the daisy chain immediately upon initiation of the self-discovery process, thus considerably speeding up the repair process.

The BISR registers may be loaded serially from the fuse box controller along the daisy chain or optionally, in parallel from a corresponding repair analysis circuit.

Advantageously, the rotatable daisy chain of the present invention permits its use in the data transfer from external to internal BISR registers (or vice versa) in the upload and verification of fuse data during a testing phase.

A system for repairing at least one embedded memory on an integrated circuit, the system comprising:

at least one repair register external to the at least one embedded memory for storing memory repair data, each external repair register being operatively coupled with a corresponding one of the at least one embedded memory for transmitting the memory repair data to the at least one embedded memory to effect repairs of the at least one embedded memory;

a plurality of serial links interconnecting each of the at least one external repair registers in series configuration to form a daisy chain commencing at a first end and terminating at a second end;

a fuse box module at the first and second ends of the daisy chain for retrieving fuse data from a non-volatile memory operatively coupled to the fuse box modules for determining a bit length of the daisy chain and thereafter using the bit length to control dissemination of the fuse data along the daisy chain;

the at least one external repair register for receiving the fuse data from along the daisy chain, for determining appropriate memory repair data and for transmitting the memory repair data to its associated memory to effect repairs of its associated memory by effecting a number of shift operations along the daisy chain equal to the bit length.

BRIEF DESCRIPTION OF THE DRAWINGS

The embodiments of the present invention will now be described by reference to the following figures, in which identical reference numerals in different figures indicate identical elements and in which.

While the invention will be described in conjunction with the illustrated embodiment, it will be understood that it is not intended to limit the invention to such embodiment. On the contrary, it is intended to cover all alternatives, modifications and equivalents as may be included within the spirit and scope of the invention as defined by the appended claims.

DETAILED DESCRIPTION OF THE PREFERRED EMBODIMENTS

The present invention will now be described for the purposes of illustration only, in conjunction with certain embodiments. It is to be understood that other objects and advantages of the present invention will be made apparent by the following description of the drawings according to the present invention.

While a preferred embodiment is disclosed, this is not intended to be limiting. Rather, the general principles set forth herein are considered to be merely illustrative of the scope of the present invention and it is to be further understood that numerous changes may be made without straying from the scope of the present invention. In particular, all dimensions described herein are intended solely to be exemplary for purposes of illustrating certain embodiments and are not intended to limit the scope of the invention to any embodiments that may depart from such dimensions as may be specified.

Figure 3:
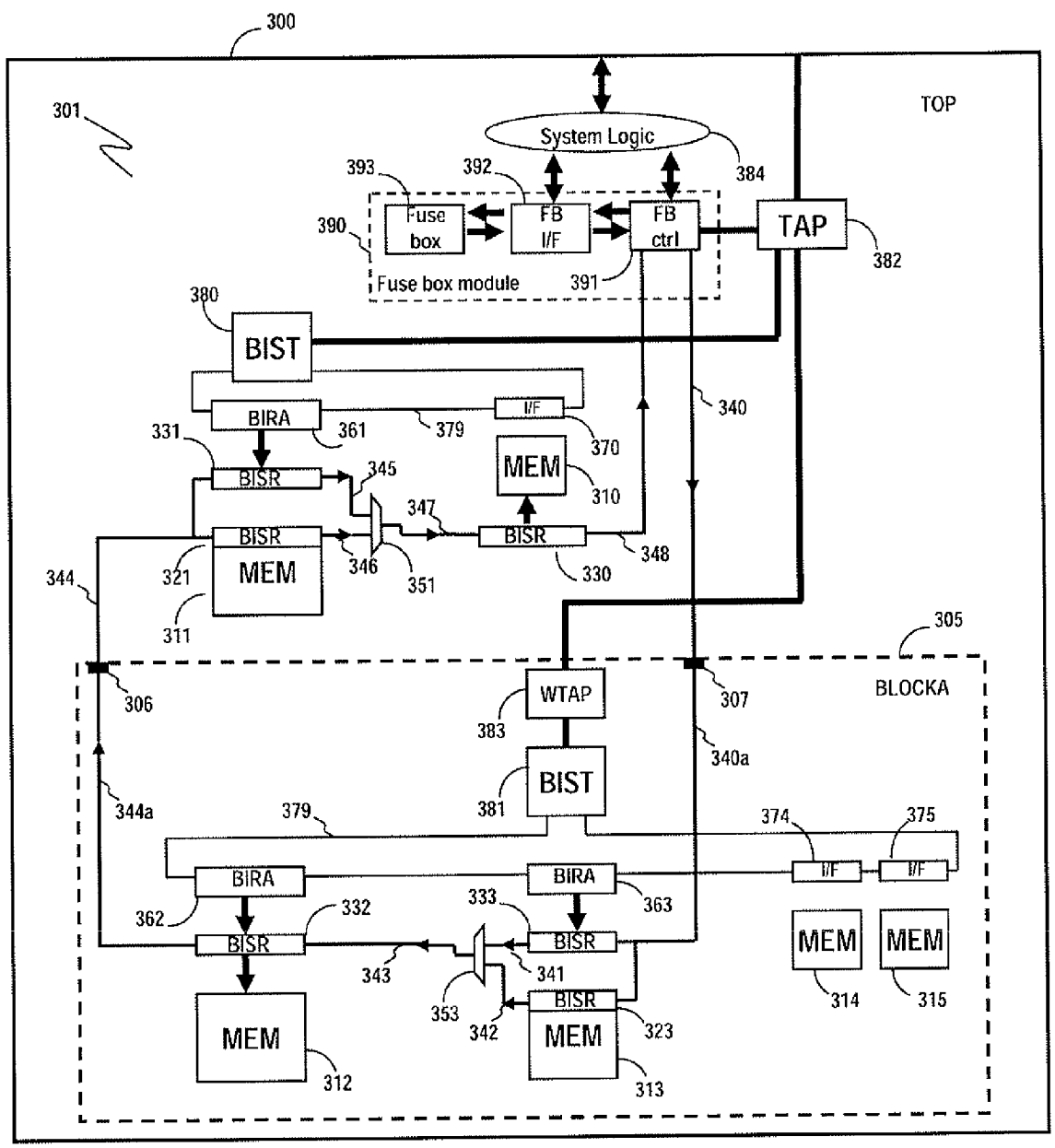
FIG. 3 is a simplified block diagram of an exemplary embodiment of the present invention adapted to operate in connection with an exemplary configuration of a plurality of memories on an integrated circuit.

Referring first to FIG. 3, there is shown, an exemplary embodiment of the present invention adapted to operate in connection with an exemplary configuration of a plurality of memories on an integrated circuit, shown generally at 300 in accordance with the present invention.

The integrated circuit 300 comprises a plurality of embedded memories 310-315, a representative sampling of which are shown. Those having ordinary skill in this art will readily appreciate that the number, type and configuration of the memories shown in FIG. 3 is exemplary and only for purposes of illustration of various features of the present invention. Any combination, type and configuration of memories appropriate to perform the desired functions of the integrated circuit 300 would be suitable.

A number of these memories 310-313 are reparable. Of these, memories 310, 312 have parallel repair interfaces, while memories 311, 313 have serial repair interfaces. Memories 314, 315 are not reparable.

Figure 1:
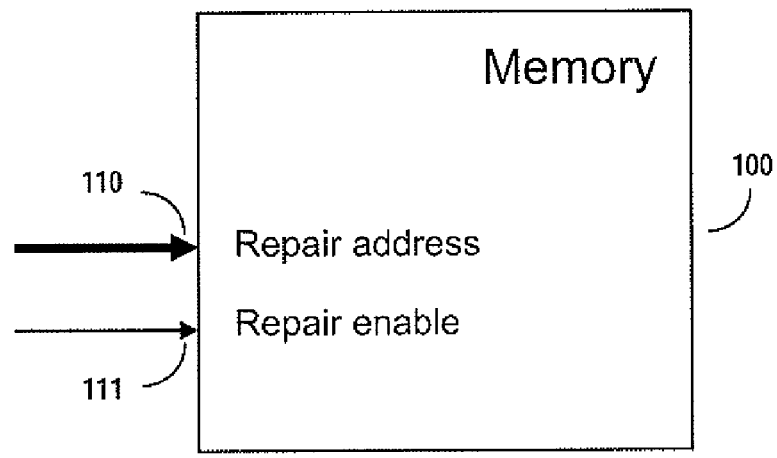
FIG. 1 is a simplified block diagram of a prior art memory showing parallel repair inputs.

Those memories 310, 312 having a parallel repair interface are assumed to be configured as shown in prior art FIG. 1, accepting a repair address bus 110 and a repair enable control line 111 as described above.

Figure 2:
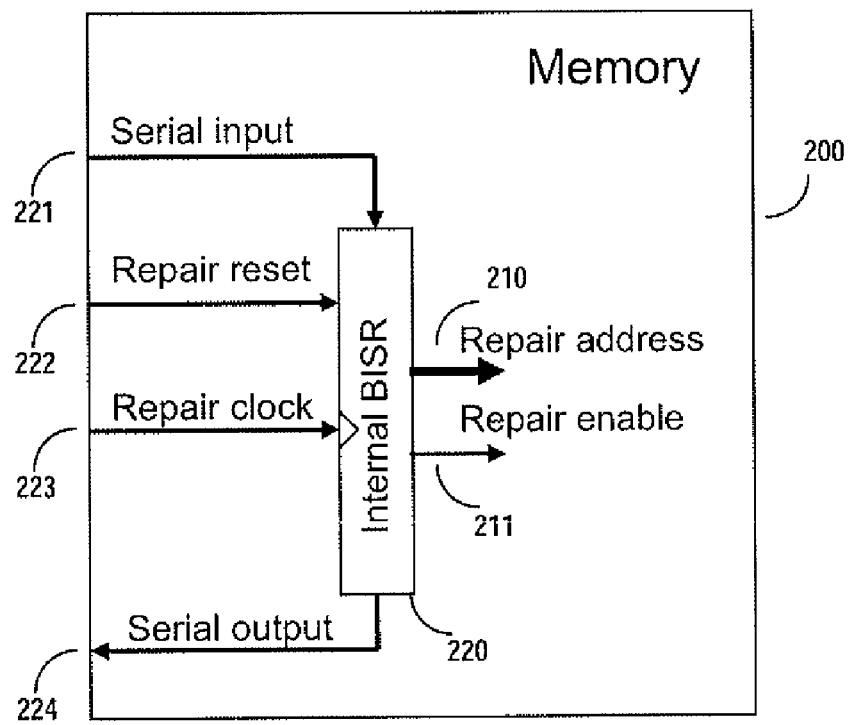
FIG. 2 is a simplified block diagram of a prior art memory showing serial repair inputs.

Those memories 311, 313 having a serial repair interface have internal BISR registers 321, 323 respectively associated therewith. For purposes of illustration, it is assumed that internal BISR registers 321, 323 are configured as shown in prior art FIG. 2, having a serial input line 221, a repair reset line 222 and a repair clock line 223 as inputs and generating a serial output line 224 external to the memory, a repair address bus 210 and a repair enable control line 211 as described above for use within the memory.

It may be seen, again only for illustrative purposes, that memories 312-315 may be part of a pre-designed circuit block 305 designated Block A and defined by dotted outline. Those having ordinary skill in this art will appreciate that a given integrated circuit 300 may contain zero, one or more of such pre-designed circuit blocks 305 and that each such block may have a different configuration from each other and from the exemplary circuit block 305 as shown in the figure. It will also be apparent to those having ordinary skill in this art that, although not shown in the figure, a pre-designed circuit block may itself contain zero, one or more pre-designed circuit blocks, creating a hierarchical architecture of even considerable degree.

The system of the present invention, shown generally at 301, comprises a plurality of external BISR registers 330-333, a plurality of daisy chain connections 340-348, a plurality of multiplexers 351, 353, a plurality of Built-In Repair Analysis (BIRA) modules 361-363, a plurality of interfaces 370, 374, 375, a plurality of Built-In Self-Test (BIST) circuits 380-381, a Test Access Port (TAP) circuit 382, system logic 384 and a fuse box module 390. Because in the exemplary configuration shown there is a pre-designed circuit block 305, the system may be supplemented by a Wrapper Test Access Port (WTAP) circuit 383 situated on the pre-designed circuit block 305.

Each of the reparable memories 310-313, whether or not within a pre-designed circuit block 305, have associated therewith an external BISR register, respectively 330-333.

Figure 4:
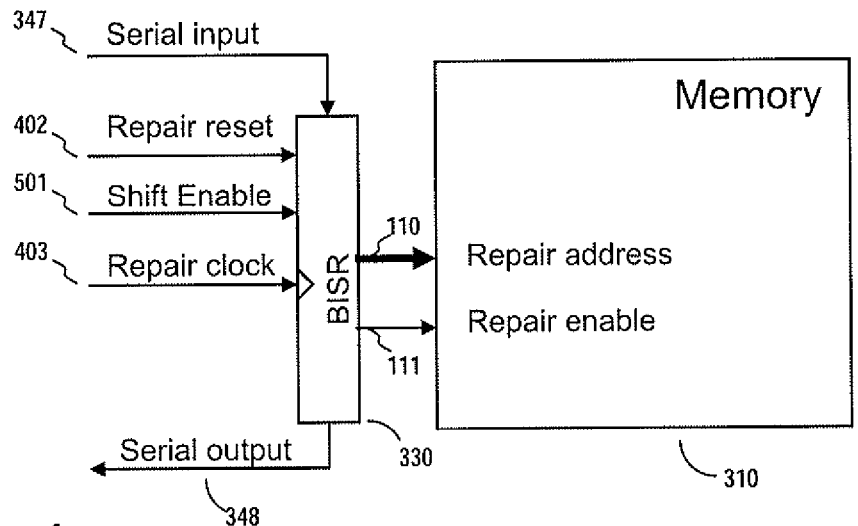
FIG. 4 is a simplified block diagram of an external BISR according to an embodiment of the present invention and its interconnection with the memory of FIG. 1.

The interconnections between external BISRs associated with a memory having a parallel repair interface may be better shown in detail in FIG. 4, using as an example, external BISR 330 and the parallel repair interface of the memory 310.

Those having ordinary skill in this art will appreciate that the configuration of other BISRs such as 332 may have comparable configurations.

External BISR 330 has a serial input, which in this case is a daisy chain connector 347, an input repair reset signal 402 and an input repair clock signal 403. The daisy chain connector 347 enters the BISR 330 from another upstream module, in this case, external BISR 331 through the multiplexer 351. Repair reset signal 402, repair clock signal 403 and shift enable signal 501 are generated by the fuse box module 390 and disseminated to all external BISRs 330-333, as well as internal BISRs 321, 323.

External BISR 330 generates a serial output, which in this case is a daisy chain connector 348 and repair address bus 110 and a repair enable control line 111 for connection into memory 310 as described above. The daisy chain connector 348 exits the BISR 330 and proceeds to a downstream module, in this case, the fuse box module 390.

Figure 5:
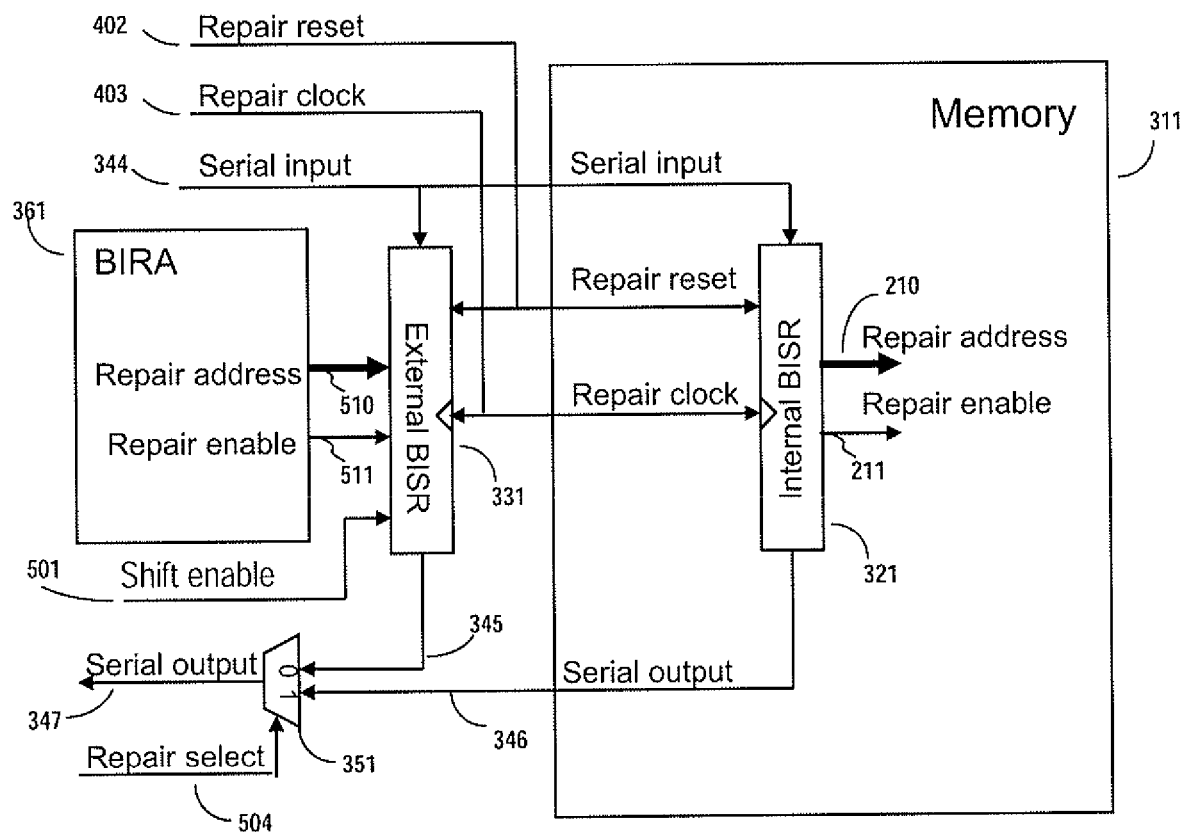
FIG. 5 is a simplified block diagram of the external BISR of FIG. 4 and a BIRA according to an embodiment of the present invention and their interconnection between them and with the memory of FIG. 2.

The interconnections between external BISRs associated with a memory having a serial repair interface may be better shown in detail in FIG. 5, using as an example, external BISR 331 and memory 311. Those having ordinary skill in this art will appreciate that the configuration of other BISRs such as 333 may have comparable configurations.

External BISR 331 has a serial input, which in this case is a daisy chain connector 344 containing fault address bits and a repair enable control signal, an input repair reset signal 402, an input repair clock signal 403 and an input shift enable signal 501. The daisy chain connector 344 enters the BISR 331 from another upstream module, in this case external BISR 332. Repair reset signal 402, repair clock signal 403 and shift enable signal 501 are generated by the fuse box module 390 and disseminated to all external BISRs 330-333, as well as internal BISRs 321, 323.

External BISR 331 generates a serial output, which in this case is a daisy chain connector 345 containing fault address bits and a repair enable control signal, which exits the BISR 331 and proceeds to a downstream module, in this case, multiplexer 351.

Those having ordinary skill in this art will appreciate that the serial input and output of external BISR 331 may intermingle or keep separate the repair enable signal and the fault address bits.

As can be seen from FIG. 5, serial input 344, repair reset signal 402 and repair clock signal 403 are also provided to corresponding internal BISR 321, which generates a serial output, in this case a daisy chain connector 346 that exits the internal BISR 321 and proceeds to a downstream module, in this case, multiplexer 351. Additionally, internal BISR 321 generates a repair address bus 210 and a repair enable control line 211 as described above for use within the memory 311.

The daisy chain connectors 340-348 interconnect modules, namely the internal BISRs 321, 323, the external BISRs 330-333, the multiplexers 351, 353 and the fuse box module 390 in a serial unidirectional chain. Signals emanate from the fuse box module 390 and proceed in turn to successive downstream modules until they are eventually received back at the fuse box module 390.

In the exemplary embodiment shown, the daisy chain path extends along a first chain from the fuse box module 390, through external BISR 333, multiplexer 353, external BISRs 332 and 331 in turn, multiplexer 351, external BISR 330 and back to the fuse box module 390 as shown by directional arrows on the daisy chain connectors 340-348.

Internal BISRs 323 and 321 are effectively connected in parallel with their corresponding external BISRs 333 and 331, sharing common input connectors 340*a* and 344 respectively and having separate output connectors 341/342 and 345/346 multiplexed together at respective downstream multiplexers 353, 351 to form a second, alternate chain in which the external BISR 333, 331 is replaced by its corresponding internal BISR 323, 321.

It will be appreciated by those having ordinary skill in this art that the first and second chains are of the same length and share common components, namely external BISRs 330, 332 associated with memories 310, 312 having parallel repair interfaces, multiplexers 351, 353 and the fuse box module 390.

Preferably, pre-designed circuit blocks 305 incorporate the present invention by providing primary connections 306, 307 to the circuit block 305. The chain within the circuit block 305, in FIG. 3 comprising segments 340*a*, either of segments 341 or 342, 343 and 344*a* then extends between the primary inputs 306, 307 so that it can be added to the higher level chain segment, in the example, between segments 340 and 344.

Optionally, pre-designed circuit block 305 could provide a by-pass mechanism (not shown) providing an effective short circuit across its primary inputs 306, 307, so that its repair registers, which presumably have already undergone design verification, are temporarily removed from the chain in order to simplify and/or accelerate the design verification of the top level block only.

As may be seen in detail in FIG. 5, multiplexer 351 accepts as input a serial output from each of the immediately upstream external BISR 331 and its corresponding internal BISR 321, along daisy chain connectors 345 and 346 respectively and generates an output signal along daisy chain connector 347 to its immediately downstream module, in this case, external BISR 330. The data stream along its output corresponds to the data stream received at one or the other of its inputs, under control of a repair select signal 504 generated by the fuse box module 390. Manipulation of the repair select signal 504 at the fuse box module 390 permits instantaneous switching between the first and the second chains described above. In the illustrated embodiment, a logical "0" for the repair select signal 504 causes the first chain, consisting of all of the external BISRs 330-333 to be selected, while a logical "1" for the repair select signal 504 causes the second chain, consisting of the internal BISRs 321, 323 and external BISR 330, 332, for which there is no associated internal BISR, to be selected.

BIRA modules 361-363 provide repair analysis capability to their associated memory 311-313 respectively. Preferably, each reparable memory 310-313 has an associated BIRA module. However, as shown in exemplary fashion in respect of memory 310, some reparable memories have no associated BIRA module, typically for reasons of economy of silicon real estate on the integrated circuit 300. In such situations, the repair analysis capability may be provided off-chip by a tester, many versions of which are well known in the art.

Figure 6:
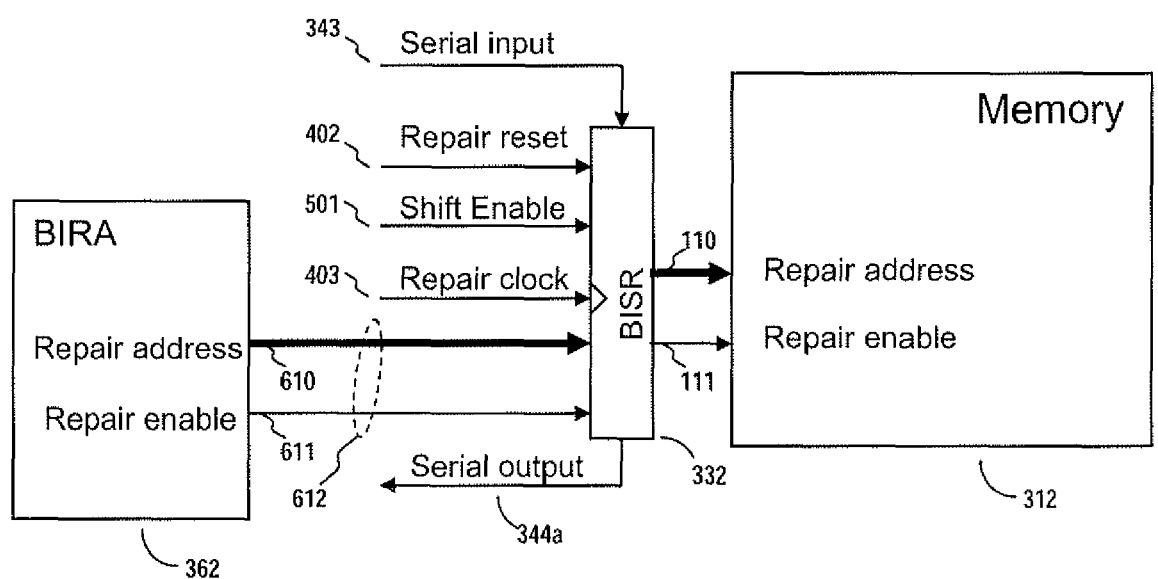
FIG. 6 is a simplified block diagram of the external BISR of FIG. 4 and showing its interconnection with the BIRA of FIG. 5.

As shown in greater detail in FIGS. 5 and 6, showing the interconnection of a BIRA module 361, 362 with an external BISR 331, 332 respectively and associated with a memory 311, 312 having respective serial and parallel repair interfaces, the BIRA 361, 362 is connected to the external BISR 331, 332 by a repair address bus 510, 610 and by a repair enable control line 511, 611, having functionality similar to that described in respect of the repair address bus 110 and repair enable control line 111 shown in prior art FIG. 1. Repair bus 612 comprises repair address bus 610 and repair enable control line 611.

Figure 7:
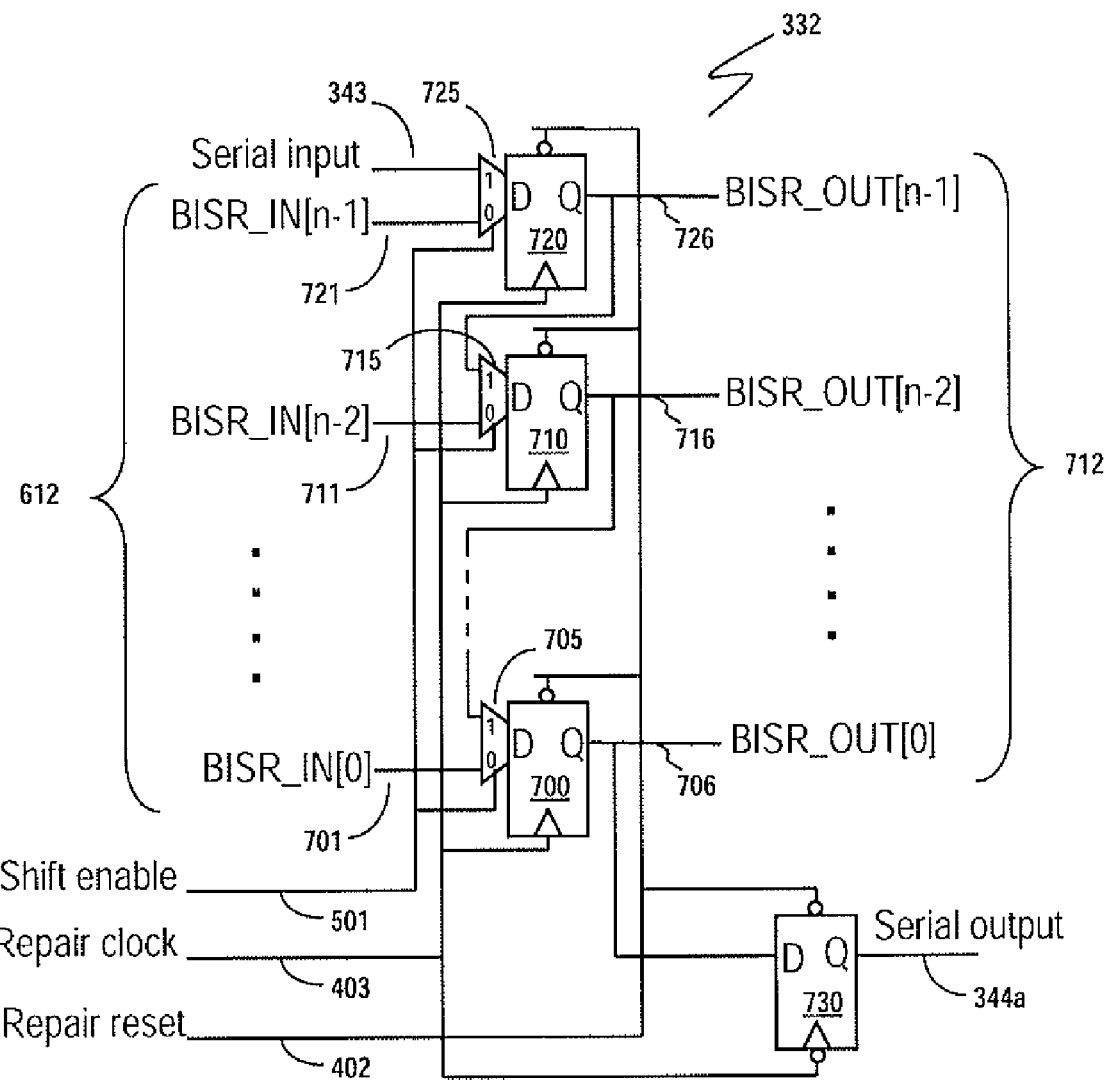
FIG. 7 is a block diagram of an exemplary embodiment of the external BISR of FIG. 5.

FIG. 7 shows an exemplary implementation of an external BISR 331-333 suitable for use between a BIRA module 361-363 and either of a memory having a serial repair interface 311, 313 or a memory having a parallel repair interface 312. The BIRA modules 361-363 receive the test data and results from tests initiated by the BIST circuits 380, 381 along signal lines extending between the BIST circuits 380, 381 and the BIRA modules 361-363, and maintain a history of failures detected during the testing phase initiated by the BIST circuits 380, 381 of the respective memory 311-313 with which they are associated; and analyze the failure data to determine, in respect of their respective memory, whether memory is completely functional (i.e. error-free), reparable (i.e. all detected faults can be repaired) or irreparable (i.e. there is insufficient redundant memory to repair all detected faults).

The external BISR shown generally at 332 is comprised of a plurality of n flip-flops 700, 710, 720, commonly clocked by repair clock signal 403, where n is the number of bits occupied by repair buses 612 and 712. Repair bus 712 comprises repair address bus 110 and repair enable control line 111. The data input D of each of the flip-flops 700, 710, 720, is tied to the output of a corresponding two-input multiplexer 705, 715, 725, commonly controlled by shift enable signal 501. Each of the bits presented to the external BISR 332 along repair bus 612 is connected to a corresponding input of each multiplexer 705, 715, 725. In the illustrated embodiment, the least significant bit of repair bus 612, designated BISR_IN[0] 701 is presented to input 0 of multiplexer 705, while the most significant bit, designated BISR_IN[n−1] 721 is presented to input 0 of multiplexer 725.

Serial input signal 343 is presented to input 1 of multiplexer 725.

The output Q of each of the flip-flops 700, 710, 720 is presented to the memory 312 as a bit corresponding to repair bus 712. In the illustrated embodiment, the least significant bit of repair bus 712, designated BISR_OUT[0] 706, is taken from the output Q of flip-flop 700, while the most significant bit, designated BISR_OUT[n−1] 726 is taken from the output Q of flip-flop 725. Additionally, the output Q of a higher-order flip-flop is connected to the input 1 of the next lower-order multiplexer. Thus, as illustrated, output Q of flip-flop 720, designated BISR_OUT[n−1] 726 is connected to input 1 of multiplexer 715. Output Q of flip-flop 710, designated BISR_out[n−2] 716 is connected to input 1 of the next lower order multiplexer. Output Q of the next to lowest order flip-flop [not shown] designated BISR_OUT[1] is connected to input 1 of multiplexer 705.

Thus, as illustrated, a shift enable signal of 1 causes the external BISR 332 to operate in serial mode, in which data arriving (LSB first) along serial input 343 is successively clocked on successive clock pulses of repair clock signal 403 through the various flip-flops. This data may include data corresponding to other memories but will at some point include fault address data corresponding to the external BISR 332's associated memory 312. Serial shifting continues until the fault data can be presented to the memory 312 along repair bus 712. The fault data also continues to be serially clocked out along the serial output 344a and along the daisy chain so that even if the external BISR is being associated with a memory having a serial repair interface, such that there is no repair bus 712, it may nevertheless be presented to the internal BISR.

By contrast, a shift enable signal of 0 causes the external BISR 332 to operate in parallel mode, in which data presented along the repair address bus 612 from the associated BIRA module 362 may be presented to the corresponding bits of the repair bus 712 for presentation to the memory 312. Again, once the data has been stored in the flip-flops 700, 710, 720, it may be serially shifted out along serial output 344a and thereafter along the daisy chain.

An additional flip-flop 730 is shown, accepting at its input D the signal from output Q of the lowest order flip-flop 700, designated BISR_OUT[0] 706 and with its output Q connected to serial output 344a. This additional flip-flop 730 is optional and merely serves as a retiming flip-flop to delay the serial output of the external BISR 332 by a half clock cycle to simplify clock distribution of the repair clock signal 403 when connecting external BISRs together. Those having ordinary skill in this art will appreciate that this timing flip-flop 730 may be interposed after its corresponding multiplexer 353, 351 in the daisy chain in an external BISR 333, 331 associated with a memory having a serial repair interface, in order to dispense with the provision of a further timing flip-flop (not shown) along the serial output of the internal BISR 323, 321.

Figure 8:
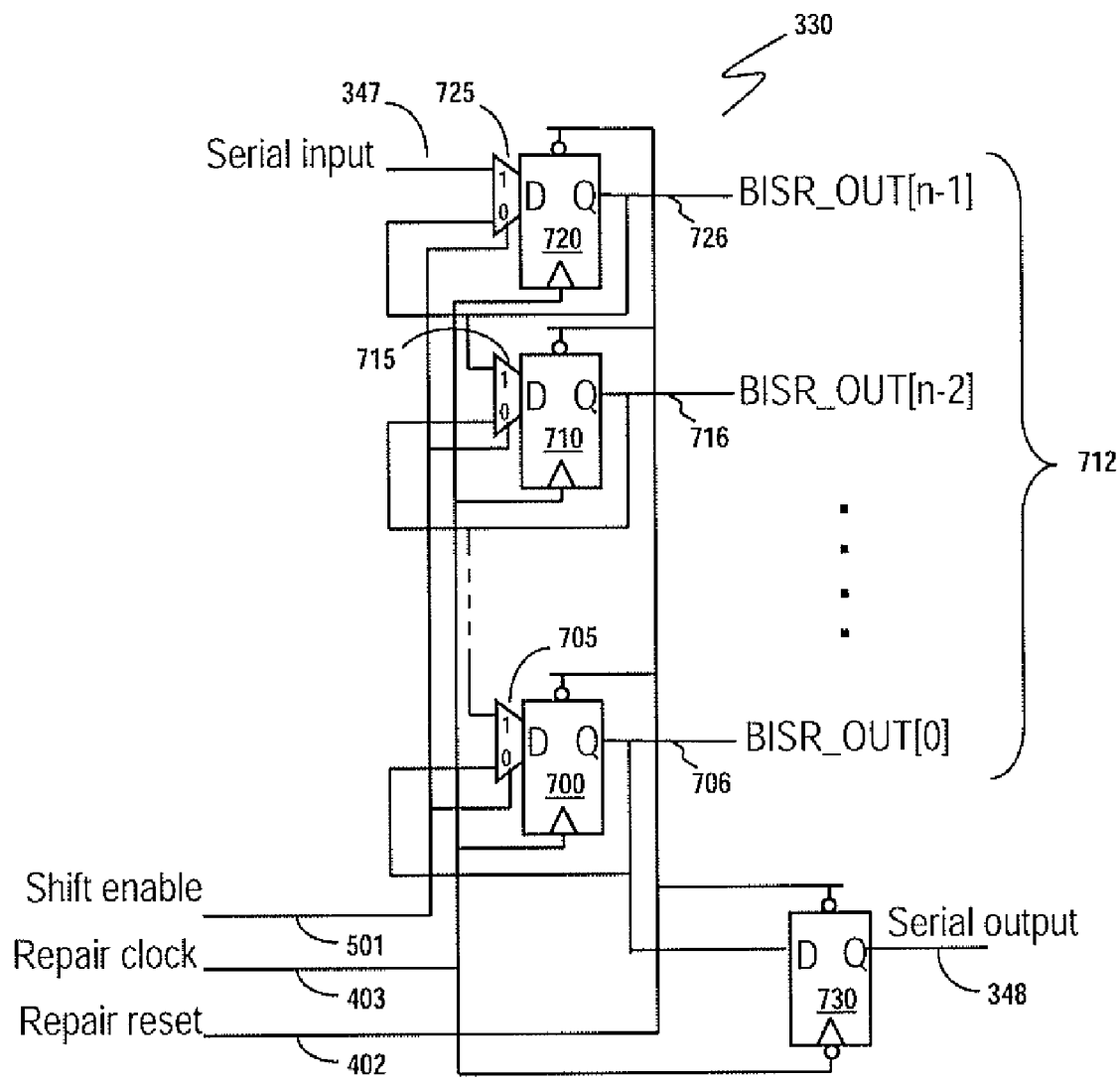
FIG. 8 is a block diagram of an exemplary embodiment of the external BISR of FIG. 4, for use in the absence of a BIRA.

FIG. 8 illustrates a potential implementation for external BISR 330, which is not accompanied by a BIRA module.

In this case, the output Q of each of the flip-flops 700, 710L, 720 continues to be presented to the memory 310 as a bit corresponding to repair bus 712, with, again, in the illustrated embodiment, the least significant bit of repair bus 712, designated BISR_OUT[0] 706 being taken from the output Q of flip-flop 700, while the most significant bit, designated BISR_OUT[n−1] 726 is taken from the output Q of flip-flop 720. As before, the output Q of a higher-order flip-flop is connected to the input 1 of the next lower-order multiplexer. Thus, as illustrated, output Q of flip-flop 720, designated BISR_OUT[n−1] 726 is connected to input 1 of multiplexer 715. Output Q of flip-flop 710, designated BISR_out[n−2] 716 is connected to input 1 of the next lower order multiplexer. Output Q of the next to lowest order flip-flop [not shown] designated BISR_OUT[1] is connected to input 1 of multiplexer 705.

However, in addition to the foregoing, the output Q of each flip-flop is also connected to the input 0 of its corresponding multiplexer. Thus, as illustrated, output Q of flip-flop 720, designated BISR_OUT[n−1] 726 is also connected to input 0 of multiplexer 725 and so on. This permits the flip-flops to hold their current states when other external BISRs within the same daisy chain perform parallel loads of repair information from their associated BIRA module.

Referring once more to FIG. 3, to the extent that its associated memory is reparable, the BIRA module 361-363 calculates fuse data that will effect the repairs of the memory and transfers fuse data to its associated external BISR 331-333 in parallel using the repair address bus 510, 610 and repair enable control line 511, 611 extending between them. If it determines that its associated memory is irreparable, it signals this through a status signal (such as signal 1001 shown at FIG. 10) generated by the BIRA module 361-363, which indicates that a memory is irreparable. This status may be propagated by shifting out through the BIST circuits 380, 381 to the TAP circuit 382 and/or the WTAP circuit 383. Alternatively, it may be propagated as a distinct bit pattern by the associated external BISR 331-333 and out along the daisy chain to the fuse box module 390.

Those memories 310, 314, 315 that do not have an associated BIRA module, either because repair analysis is being performed off-chip by a tester, or because they are irreparable, have an associated interface module 370, 374, 375. The interface module 370, 374, 374 permits test inputs generated by the BIST circuits 380, 381 to the associated memory. Primarily, it selects between such test inputs and other functional inputs. Additionally, the interface module 370, 374, 375 may compare the memory output to an expected output supplied by the BIST circuit 380, 381, preferably through a register that may optionally be accessed along a serial path 379 joining it with the BIST circuit 380, 381 and the BIRA modules 361-363. These features are also found, but not described herein, in the BIRA modules 361-363.

Memories may not have an associated BIRA module if BIRA modules were not available at the time that a pre-designed block containing the memory was designed, or because the block containing the memory, whether or not pre-designed, was area-constrained, such that a BIRA module was inappropriate. Conceivably, it is possible that a pre-designed block has BIRA modules but an integrated circuit re-using such block is area-constrained and does not use BIRA modules systematically throughout the rest of the circuit.

Figure 9:
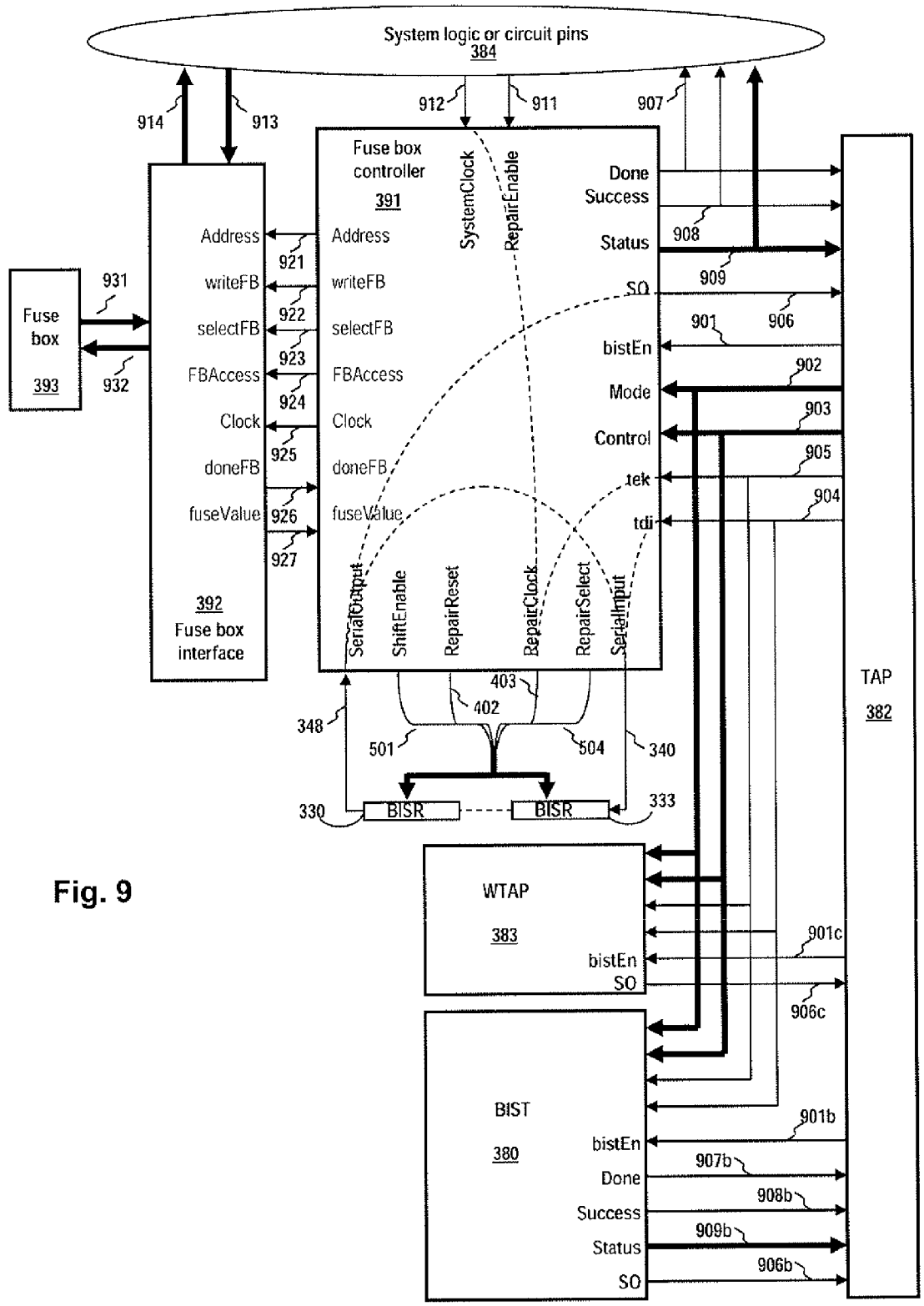
FIG. 9 is a block diagram showing connections between various components of the fuse box module, the TAP and the system logic of FIG. 3.

As shown in FIG. 9, the BIST circuits 380, 381 are interposed between the TAP 382 and/or WTAP 383 modules and at least one BIRA 361-363 and/or interface 370, 374, 375 module. The BIST circuit 380, for example, accepts "bistEN" 901b, "Mode" 902, "Control" 903, "tdi" 904 and "tck" 905 signals from the TAP circuit 382, and generates "SO" 906b, "Done" 907b, "Success" 908b and "Status" 909b signals back.

In the embodiment described in FIG. 3, a first BIST circuit 380 is provided for all of the embedded memories that lie outside the pre-designed circuit block 305 and a second BIST circuit 381 is provided for all of the embedded memories that lie within the pre-designed circuit block 305. While it is preferable that memories within a common pre-designed circuit block 305 are serviced by at least one BIST circuit 381 associated therewith, those having ordinary skill in this art will appreciate that it is possible to service a plurality of pre-designed circuit blocks 305 and/or memories that lie outside any such blocks with a common BIST circuit. Additionally, depending upon the number, size and configuration of the embedded memories in the integrated circuit 300 or indeed, within a pre-designed circuit block 305 thereon, it may be advantageous to allocate the BIST functions among a plurality of BIST circuits.

However configured, the BIST circuits 380, 381 perform testing of the various memories on the integrated circuit 300 and return the test data and results to the various BIRA modules 361-363 and to an off-chip tester (not shown) through the TAP 382 and as appropriate, WTAP 383 circuits.

The TAP circuit 382 is a circuit for supplying control signals between the fuse box module 390, the system logic 384 and off-chip, for example, to a memory tester, in accordance with an appropriate protocol. In the exemplary scenario, the TAP circuit 382 employs an IEEE 1149.1 communications protocol. IEEE 1149.1 protocol interface off-chip may comprise a clock, a serial input, a serial output, a reset and a control input signal (not shown).

As is better shown in FIG. 9, the TAP circuit 382 generates a number of control and data signals to the fuse box module 390, including a BIST enable ("bistEN") signal 901 that is asserted whenever operations are to be performed under TAP control, a "Mode" input 902 that specifies which of several operational and/or diagnostic modes to enter, a series of control (collectively referenced as "Control") signals 903, a serial input ("tdi") signal 904 and a clocking input ("tck") signal 905 which may be respectively connected to the serial input 340 and the repair clock signal 403 of the fuse box module 390 when data is to be inserted from off-chip through the TAP circuit 382 for circulation through the various BISRs through the daisy chain under TAP control in one of the diagnostic modes.

In some circumstances, the "Mode" input 902 may select a register for access through the TAP circuit 382, which register may be situated in either the fuse box module 390 or can be the daisy chain itself. Wherever it is situated, the "Control" signals determine the operation(s) performed by such register, such as a shift, capture, update, reset or hold operation. Some of these operations have impact on other signals in the fuse box module 390, for example, the Shift Enable signal 501 and/or in certain circumstances, the Repair Reset signal 402

Additionally, the TAP circuit 382 receives a number of control and data signals from the fuse box module 390, including: a serial out ("SO") signal 906, which may be connected to the serial output 348 and clocked out under control of the clocking input ("tck") signal 905 when data retrieved from the various BISRs 321, 323, 330-333 through the daisy chain is to be sent off-chip through the TAP circuit 382 in one of the diagnostic modes, and "Done" 907, "Success" 908 and "Status" 909 signals. The "Done" signal 907 indicates completion of an operational mode such as self-programming or verification of the fuse data or detection of an exceptional condition such as no repairs, a memory is not reparable or the fuse box module has insufficient space to effect all repairs. The "Success" signal 908 indicates successful completion of an operational mode. The "Status" signal 909 identifies which, if any, of the exceptional conditions is applicable.

The "Mode" 902, "Control" 903, "tdi" 904 and "tck" 905 signals are also fed to the BIST circuit 380 and to the WTAP circuit 383. "bistEN" signals 901b and 901c are fed to the BIST circuit 380 and WTAP circuit 383 respectively. Further, the TAP circuit 382 accepts a "SO" 906b signal from the BIST circuit 380 and a "SO" 906c signal from the WTAP circuit 383, and "Done" 907b, "Success" 908b and "Status" 909b signals from the BIST circuit 380.

The TAP circuit 382 may be used by an off-chip tester, such as are well-known in this art to control the execution of BIST and other tests on the memories on the integrated circuit 300 and to return test data and results thereto.

As indicated, the TAP circuit 382 configures the fuse box module 390 in any of a number of operating modes as well as certain diagnostic modes for verifying the operation of aspects of the inventive system 301.

Operational modes include a self-programming mode, as described below, in which repair information identified by the BIRA modules 361-363 (in general, the contents of all registers along the daisy chain) is retrieved, compressed and stored as compressed fuse data in the fuse box module 390 or alternatively rotated to identify one of the three exceptional conditions discussed elsewhere; a verification mode in which the fuse data is read, decompressed and checked against the original contents of the daisy chain; and a repair mode, in which fuse data is read, decompressed and circulated to the BISRs 321, 323, 330-333 through the daisy chain after power-up of the integrated circuit 300, in order to effect repairs of any memory faults identified during testing of the integrated circuit 300 during a manufacturing phase.

Diagnostic modes include, but are not limited to, performing read and write accesses to the fuse box module 390 and transferring repair information to and/or from the BISRs 321, 323, 330-333 through the daisy chain.

Similarly, the WTAP circuit 383 permits communications to proceed between the TAP circuit 382 and circuitry within a pre-designed circuit block 305 in accordance with an appropriate protocol, thus providing an additional level of test control. In the exemplary scenario, the WTAP circuit 383 employs an IEEE 1500 communication protocol.

The WTAP circuit 383 accepts "bistEN" 901c, "Mode" 902, "Control" 903, "tdi" 904 and "tck" 905 signals from the TAP circuit 382 and returns an "SO," 906c signal.

The system logic 384 comprises a plurality of circuit pins accessible off-chip that permits the exchange of signals and data on and off the chip without using the TAP circuit 382. In some embodiments, this may allow an off-chip tester to react more quickly to the three above-identified exceptional conditions and take steps to minimize test time in consequence thereof.

Additionally, while the integrated circuit 300 is operationally connected to an operational system (not shown), an autonomous repair mode may be invoked from the system logic 384 by asserting the Repair Enable 911 signal and providing a clock along the System Clock 912 signal. Repair and test results may be reported along the "Done" 907, "Success" 908 and "Status" 909 signals connected to system logic 384 and/or TAP circuit 382. The operational system (not shown) may resume normal operations once the autonomous repair mode has completed, and may take appropriate action based upon the test results reported by such signals.

Those having ordinary skill in this art will appreciate that certain embodiments may choose to implement only one or the other of the TAP circuit 382 and the system logic 384.

One exemplary configuration of the system logic 384 provides a repair enable 911 and a system clock 912 input signal to the fuse box module 390 by which the repair mode may be invoked, as well as "Done" 907, "Success" 908 and "Status" 909 signals from the fuse box module 390 as earlier described. The system clock 912 input signal may be connected to the repair clock signal 403.

Optionally, as is discussed elsewhere, the fuse box module 390 may contain certain non-repair information related to the memories and I/O pad drivers of the integrated circuit 300, parametric information such as the output slew rate, pre-emphasis, that are adjustable for each individual instance of the integrated circuit 300, or chip function information such as serial number or a code key.

In some embodiments, the system logic 384 may have certain input and output data and control lines 913, 914 to access, store and retrieve such non-repair information in the fuse box module 390. Such non-repair information may be stored and retrieved independently of the repair information, in which case, the store/access may be performed through input and output data and control lines 913, 914, or through the TAP circuit 382. If the non-repair information is merged with repair information it is stored in a BISR register (not shown), which would be part of the daisy chain. The BISR register could be coupled to a macro module (e.g. an I/O pad) or any other circuit employing the non-repair information.

The fuse box module 390 comprises a fuse box controller 391, a fuse box interface 392 and a fuse box itself 393. The fuse box controller 391 is coupled to the fuse box 393 through a fixed interface with the fuse box interface 392. The fuse box controller 391 deals with the majority of communications off-chip, whether through the TAP circuit 382 or the system logic 384, and directs all operations of the inventive system 301 and all communications with the remainder of the components thereof.

The fuse box controller 391 generates a serial input signal 340 to the daisy chain connections 340-348 and receives a serial output signal 348 therefrom. Additionally, it generates control signals to each of the external BISRs 330-333 which include the repair reset 402, repair clock 403, shift enable 501 and optionally, repair select signals 504.

The fuse box controller 391 receives the "bistEN" 901, "Mode" 902, "Control" 903, "tdi" 904 and "tck" 905 signals from the TAP circuit 382 and generates the "SO" 906, "Done" 907, "Success" 908 and "Status" 909 signals to the TAP circuit 382. As discussed previously, the serial input 340, repair clock 403 and serial output 348 signals to and from the BISRs 321, 323, 330-333 may optionally be connected to the "tdi" 904, "tck" 905 and "SO" 906 signals to and from the TAP circuit 382.

The fuse box controller 391 receives the repair enable 911 and the system clock 912 signals from the system logic 384. The signals are used to initiate the repair mode from the system logic 384, rather than the TAP circuit 382, since the latter may not be available in the system. The repair clock signal 403 may (also or as an alternative to connection with the "tck" signal 905 from the TAP circuit 382) be connected with the system clock signal 912 from the system logic 384.

The fixed interface with the fuse box interface 392 comprises a number of output and input signals. The fuse box controller 391 transmits to the fuse box interface 392: an address signal 921, indicating the address of a fuse to be accessed; a write/read ("writeFB") signal 922, indicating whether a write or read access is being requested; a select ("select FB") signal 923, indicating that the fuse box controller 391 is about to perform a series of read and/or write operations to the fuse box 393; an access ("FBAccess") signal 924, indicating a specific write or read access request of a location specified by the address signal 921; and a clock signal 925 generated by the fuse box controller 391 for synchronizing all signals. In the embodiment described herein, a "writeFB" signal 922 value of "1" denotes a write access and a value of "0" denotes a read access.

The fuse box controller 391 receives from the fuse box interface 392: an access complete ("doneFB") signal 926 indicating completion of the access request; and a fuse value signal 927 returning the result of a read access. In the embodiment described, a single bit of the fuse value signal 927 is read at a time.

An access request from the fuse box controller 391 does not necessarily result in an access of the fuse box 393. For example, the fuse box interface 392 may contain a cache of values that have been previously read from the fuse box 393. Thus, if the fuse box controller 391 performs a read access to a fuse address that is already available in the cache, the fuse box interface 392 may make this value available as the "fuse value" output and assert the "access complete" signal.

Similarly, for a memory that writes (programs) multiple fuses at the same time in the fuse box 393, several single bit write requests from the fuse box controller 391 may be performed to a cache corresponding to a word of the fuse box 393 and the actual write operation to the fuse box 393 performed only when a different word is being addressed.

It should be noted that no fuse value is specified on a write operation because non-volatile memories are typically initialized to a first value, usually all "0"s, and only the fuses that are to be written (programmed) to a second value are specified.

Thus, the design of the fuse box controller 391 is insensitive to changes in the number of memories, their order in the chain or their hierarchical location. Given that changes are frequently made during the design of an integrated circuit 300, such changes will not introduce a consequential bottleneck in the design of the repair system 301 at or near the end of the design cycle. Indeed, the fuse box controller 391 does not generally interpret the repair information that it receives.

Additionally, the fuse box controller 391 can manage repair information for integrated circuits 300 that have a mixture of serial and parallel repair interfaces and/or a mixture of different test and repair analysis circuits, such as is shown in the illustrated embodiment. This capability provides flexibility when considering the re-use of pre-designed circuit blocks 305 that could potentially emanate from a different design group and even a different company.

Further, as discussed elsewhere, the fuse box controller 391 can manage information, such as memory timing control information, other than memory repair information. Indeed, the external BISRs 331-333 of the inventive system 301 may be coupled to macro modules rather than memory modules per se. As an example, I/O pad drivers (not shown) connected to integrated circuit pins may sometimes use timing information to control their slew rate, pre-emphasis and other parameters.

The fuse box interface 392 provides a fixed interface with the fuse box controller 391 and coordinates communications with the fuse box 393, which may be different for different technologies and make use of different types of non-volatile memory, which may call for variations in access timing and protocol. Additionally, if, as described elsewhere, the system logic 384 may access, store and retrieve non-repair information in the fuse box module 390, such access may be effected through the fuse box interface 392.

The fuse box interface 392 receives from the fuse box controller 391: an address signal 921, indicating the address of a fuse to be accessed; a write/read ("writeFB") signal 922, indicating whether a write or read access is being requested; a select ("select FB") signal 923, indicating that the fuse box controller 391 is about to perform a series of read and/or write operations to the fuse box 393; an access ("FBAccess") signal 924, indicating a specific write or read access request of a location specified by the address signal 921; and a clock signal 925 generated by the fuse box controller 391 for synchronizing all signals. In the embodiment described herein, a "writeFB" signal 922 value of "1" denotes a write access and a value of "0" denotes a read access. Further, since the address signal 921 may point to more than one fuse, the fuse box interface 392 is adapted to perform any appropriate mapping of the address data supplied by the fuse box controller 391

Further, an access request from the fuse box controller 391 may not inevitably result in an access of the fuse box 393, as the fuse box interface 392 may optionally maintain a cache of values that have been previously accessed from the fuse box 393. In such a case, as discussed previously, if the fuse box controller 391 seeks read access to a fuse address already available in the cache, the fuse box interface 392 may simply make available the cached value without actually accessing the fuse box 393 again.

The fuse box interface 392 transmits to the fuse box controller 391: an access complete ("doneFB") signal 926 indicating completion of the access request; and a fuse value signal 927 returning the result of a read access. In the embodiment described, a single bit of the fuse value signal 927 is read at a time and no fuse value signal 927 is specified for a write access because most non-volatile memories are initialized to a first value, usually all "0"s and only those fuses that will be set to a second value, usually "1", are specified.

If the system logic 384 is configured to access, store and retrieve non-repair information in the fuse box module 390, such access may be effected through signals 913, 914 to and from the fuse box interface 392.

Finally, the fuse box 392 interfaces with the fuse box 393 through data and control lines 931, 932 in a manner specific to the particular implementation and technology of the fuse box 393.

The fuse box 393 is the repository of all compressed fuse data and optionally, non-repair data as well. It interfaces with the fuse box interface 392 through data and control lines 931, 932 in a manner specific to the particular implementation and technology of the fuse box 393.

Figure 10:
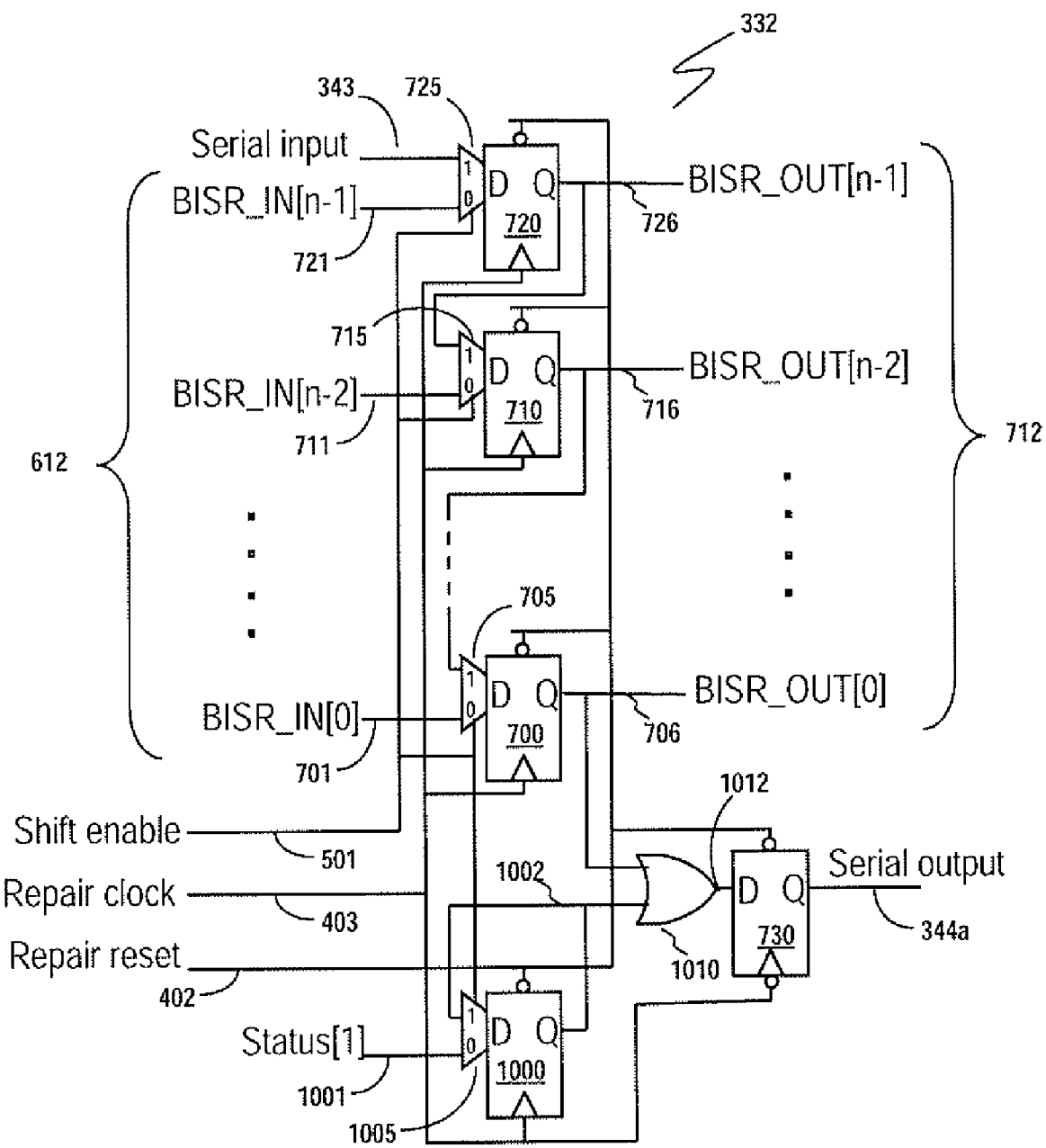
FIG. 10 is a block diagram of the BISR of FIG. 7, showing additional logic to track the exceptional condition of an irreparable memory.

FIG. 10 illustrates a potential implementation of the external BISR 332 to accommodate the exceptional circumstance described elsewhere when one or more of the embedded memories are declared irreparable. The modification introduced in FIG. 10 permits the fuse box controller 391 to unmistakably detect the occurrence of an irreparable memory even though the fuse box controller 391 may not have any memory-specific information useful for interpreting the contents of the BISR registers 321, 323, 330-333.

The modification consists of the addition of an additional flip-flop 1000, a two-input multiplexer 1005 and an OR gate 1010. The multiplexer 1005 is controlled by the shift enable signal 501. In the illustrated embodiment, a status signal 1001 from the BIRA module 362 associated with the memory 312 which, when set to "1" indicates that memory 312 is irreparable, is input into the "0" input of multiplexer 1005. The output of multiplexer 1005 is fed into the input D of flip-flop 1000. The output Q 1002 of multiplexer 1000 is fed back into the "1" input of multiplexer 1005 and to an input of the OR gate 1010. The output Q 706 of the lowest-order flip-flop 700, designated BISR_OUT[0], is fed into the other input of the OR gate 1010 and the output thereof is fed into the input D of re-timing flip-flop 730.

Thus, the detection of an irreparable memory may be propagated to force all bits of the serial output stream 344a from BISR 332 to "1". With rotation of the BISR contents throughout the daisy chain and discussed below, this can be propagated to all BISRs 330-333 to inform them of this exceptional circumstance.

Those having ordinary skill in this art will readily appreciate, however, that the configuration of FIG. 10 will not convey to the fuse box controller 391 any information as to the number of which memories are irreparable. This diagnostic information may be retrieved by accessing the BIRA modules 361-363 through the TAP circuit 382, WTAP circuit 383 and/or BIST circuits 380, 381 as appropriate.

The operation of the inventive system 301 will now be described. It makes use of the capability to rotate data from one BISR 321, 323, 330-333 to every other BISR connected by a daisy chain connection 340-348 and to propagate such data to and from the fuse box controller 391 and thus to and from the fuse box 393.

This rotational capability may be applied to effect each of the operational modes of the inventive system 301, including the self-programming and verification modes.

The self-programming mode may be invoked during or at the conclusion of a test phase of the manufacturing process. In such a phase, the BIST circuits 380, 381, preferably under direction of an off-chip tester (not shown) through communications along the TAP circuit 382 and/or the WTAP circuit 383, perform read and write operations on the various memories 310-315, including the non-reparable memories 314, 315. The results of such operations and their expected results are communicated to the BIST circuits 380, 381 through the BIRA modules 361-363 associated with the memory 311-313 and through the interface modules 370, 374, 375 if there is no associated BIRA module.

If a failure is detected in a non-reparable memory 314, 315, the BIST circuit 380, 381 and/or the interfaces 370, 374, 375 signals the condition that the associated memory is not reparable to the off-chip tester (not shown) through the TAP circuit 382 and/or the WTAP circuit 383 as the case may be. In this case, the integrated circuit 300 is declared irreparable and discarded.

Otherwise, if a failure is detected in a reparable memory 310-313, and that memory has an associated BIRA module 361-363, the failure detection is maintained in the BIRA module 361-363 and a fuse datum corresponding to a repair is identified and maintained therein for transmission to the associated external BISR 331-333 as part of the self-programming mode. If however, the failure is detected in a reparable memory 310 that has no associated BIRA module, the failure detection is maintained in the BIST circuit 380, and a fuse datum corresponding to a repair is identified and maintained therein for transmission to the associated external BISR 330.

In a preferred mode of operation for an integrated circuit 300 having a mixture of reparable memories 310-313, with or without associated BIRA modules 361-363, memories 310 without an associated BIRA circuit are tested first. BIST circuit 380 supports a diagnostic mode, such as is described in U.S. Pat. No. 6,779,938, entitled "Method for Collecting Failure Information for a Memory Using an Embedded Test Controller", issued May 18, 2004 to Nadeau-Dostie et al. The diagnostic results are interpreted by software on the tester (not shown), to calculate the repair information, which is shifted along the daisy chain via the TAP circuit 382 and the fuse box controller 391.

Thereafter, memories 311-313 with associated BIRA modules 361-363 are tested. The repair information is calculated on-chip without intervention from the off-chip tester (not shown).

Once all of the testing phase has been completed, the identified fuse data in each of the BIRA modules 361-363 corresponding to reparable memories 311-313 that have detected failures may be communicated to their corresponding external BISRs 331-333 as part of a first stage of the self-programming mode.

This may be accomplished by a parallel data transfer of the fuse data from the BIRA module 361-363 to its corresponding external BISR 331-333 along its corresponding repair address bus 510, 610 and repair enable control line 511, 611.

The second stage of the self-programming mode may then be effected to transfer the fuse data from the external BISRs 331-333 to the fuse box controller 391 for compression and storage in the fuse box 393. This second stage makes use of the rotational capability of the daisy chain extending between the various external BISRs 331-333 and the fuse box controller 391 along the first of the two identified daisy chains.

This rotational capability does not rely on any institutional knowledge by the fuse box controller 391 of the number, size or configuration of any of the memories 310-315 on the integrated circuit 300, whether or not part of a pre-designed circuit block 305. Rather, at an initial point after each power-up of the integrated circuit, the fuse box controller 391 initiates a daisy chain self-discovery test to determine the length in bits of the two identified daisy chains.

This self-discovery test may be performed simply by initializing each of the bits in each of the BISRs in the daisy chain (for the purposes of this discussion we will assume that it is the first daisy chain that encompasses only the external BISRs 330-333, although persons of ordinary skill in this art will appreciate that the same test may be performed on the second daisy chain instead) to logic "0" by asserting the repair reset signal 402 to all BISRs 321, 323, 331-333 and thereafter sending a single logical "1" bit out along daisy chain connector 340 and clocking it along the daisy chain serially using the repair clock signal 403 until it is received back by the fuse box controller 391 along daisy chain connector 348. The number of clock cycles of the repair clock signal 403 used to cause the logical "1" bit to circulate along the daisy chain corresponds to the length of the daisy chains and thereafter completely defines the institutional knowledge of the configuration of the integrated circuit 300 relied upon by the fuse box controller 391.

Alternatively, the bit length of the daisy chains may be determined during the design of the integrated circuit 300 and hard-wired into the fuse box module 390 for later retrieval.

Thus, however determined, in the second stage of the self-programming mode, armed with this information, it suffices that the fuse box controller 391 set the repair select signal 504 to a value (in the illustrated embodiment, logical "0") to select the first daisy chain and then to issue the number of clock cycles of the repair clock signal 403 corresponding to the length of the daisy chains to ensure that all of the fuse data stored in the external BISRs 331-333 is returned to the fuse box controller 391.

While the fuse box controller 391 does not rely on the information content of the observed bits from the daisy chain, observation of these bits during the self-programming mode may provide additional and welcome information concerning the exceptional conditions discussed previously. For example, upon observing the receipt of all logical "0"s, the fuse box controller 391 may conclude that there were no faults detected. On the other hand, if the external BISRs were configured as described in FIG. 10, observing the receipt of all logical "1"s would signal to the fuse box controller 391 that an irreparable fault was encountered in respect of at least one of the memories 310-313.

For completeness, the fuse box controller 391 would detect and be able to signal the presence of the third exceptional condition, namely that the fuse box 393 does not have sufficient room, even with the application of data compression as described above, to house all of the fuse data, if all of the non-volatile locations in the fuse box 393 are utilized before the end of the bits in the received daisy chain have been encoded therein.

In an alternative embodiment, given the long memory write times of the non-volatile memory in the fuse box 393, the fuse box controller 391 may perform the self-programming mode in two steps. In the first step, the contents of the daisy chain are retrieved and compressed by the fuse box controller 391. However, no write requests are sent to the fuse box 393. The daisy chain is also concurrently rotated. In the second step, if it is determined that there are enough fuses in the fuse box 393 to service the integrated circuit 300, the contents of the daisy chain are again retrieved and compressed and the write requests are sent to the fuse box 393. Once again, the daisy chain is also concurrently rotated. The concurrent rotation permits the daisy chain to be immediately re-used in a subsequent operation.

Preferably, once the fuse box controller 391 has received the fuse data, it is compressed in accordance with any number of suitable data compression methodologies as may be known to those having ordinary skill in this art. Since most reparable memories 310-313 will not exhibit faults or call for repair, most of the fuse data bits stored in the external BISRs 331-333 will have a value of logical "0". Thus, one approach to compressing the fuse data is to perform a version of run-length encoding, by counting the number of consecutive logical "0"s observed by the fuse box controller 391 arriving along daisy chain connector 348 before a logical "1" is detected. The count of logical "0" bits may be then stored in the fuse box 393. In some embodiments, a pre-determined number of bits is allocated for this first count of logical "0" bits.

Thereafter, a second pre-determined number of bits is stored as observed by the fuse box controller 391 arriving along daisy chain connector 348, starting with the detected logical "1" if encountered within the capacity of the first count. This second group of bits is stored as received, without compression, because there is roughly an equal probability of logical "0"s and logical "1"s corresponding to a faulty memory.

Once this second pre-determined number of bits is stored, a second count of consecutive logical "0"s is maintained and stored, followed by another group of a pre-determined number of bits which is stored as received.

This process continues until all of the bits in the daisy chain have been processed. In this fashion, the programming of the fuse data into the fuse box 393 may be automatically effected using the rotational capabilities of the inventive system 301.

Simulations suggest that excellent results may be obtained by setting the first pre-determined number of bits to equal the logarithm, base 2, of the length of the daisy chain and the second pre-determined number of bits to the maximum length of the portion of a repair register that may be used to address a single redundant column, row or location. However, other parameters could equally be used with varying results. Such parameters may be set based upon approximate values of the daisy chain length and length of repair registers. Then, configurations based thereon may accommodate last-minute design changes, albeit in a sub-optimal fashion.

The use of the inventive system 301 for self-programming of the fuse box 393 enables testing and repair of a plurality of integrated circuits in parallel under the control of an off-chip tester (not shown), because all circuit-specific repair information is handled by the on-chip fuse box controller 391. The length of time for performing the self-programming mode is dictated by the memory with the greatest number of fuses to be programmed.

Such time may be made fixed or variable. Fixed times, such as one-half of the product of the number of available fuses and the time to program a single fuse, are generally easier for testers to handle, and may be satisfactory with moderate fuse programming times. Otherwise, it may be desirable to have the tester wait until all circuits set their "Done" 907 signal. Such a variable method trades off programming complexity with reduced test time.

The capability to perform the memory testing phase in parallel, for instance of all integrated circuits 300 housed on a single wafer, may significantly reduce manufacturing costs.

The self-programming mode may also be performed upon completion of the testing phase. Indeed, inasmuch as the actual storage of the fuse data in the non-volatile memory of the fuse box 393 by the fuse box controller 391 is relatively slow, preferably the self-programming mode is executed twice. The first iteration verifies that the fuse data developed is appropriate to effect repairs of all reparable memories on the integrated circuit 300, prior to actually programming in the fuse data into the fuse box 393 during the second iteration.

Upon completion of the self-programming mode, a verification mode may be invoked, which comprises effectively invoking the repair mode, with two minor modifications. First, the bit length of the daisy chain, being already known, is not determined. Second, the serial output of the daisy chain containing the fuse data is compared against the serial input that results from the reading and decompression of the fuse data in the fuse box 393.

The verification mode confirms that the self-programming and repair modes are consistent, so that the repair information contained in the external BISRs 330-333 may be regenerated from the fuse box 393.

Finally, the repair mode occurs after power-up of the integrated circuit 300, upon completion of the self-programming mode during the manufacture of the integrated circuit 300.

First, the fuse box controller 391 determines the length of the daisy chain as earlier described. Second, the fuse data stored in the non-volatile memory in the fuse box 393 is retrieved and decompressed and inserted into the first daisy chain. The insertion of the fuse data may commence as soon as the logical "1" inserted in the self-discovery phase has been received. After output of the fuse data, the daisy chain has been so shifted that the data has been repopulated into the external BISRs 330-333.

At this point, the fuse data is applied from the external BISR registers 330, 332 to the input of associated memories 310, 312 having parallel repair interfaces by a parallel dump of the fuse data along the repair address bus 110 and the associated repair enable control signal 111.

For those memories having a serial repair interface, internal BISRs 321, 323 contain the appropriate fuse data, which may be applied to a memory decoding circuit (not shown) through repair address bus 210 and associated repair control signal 211.

Figure 11:
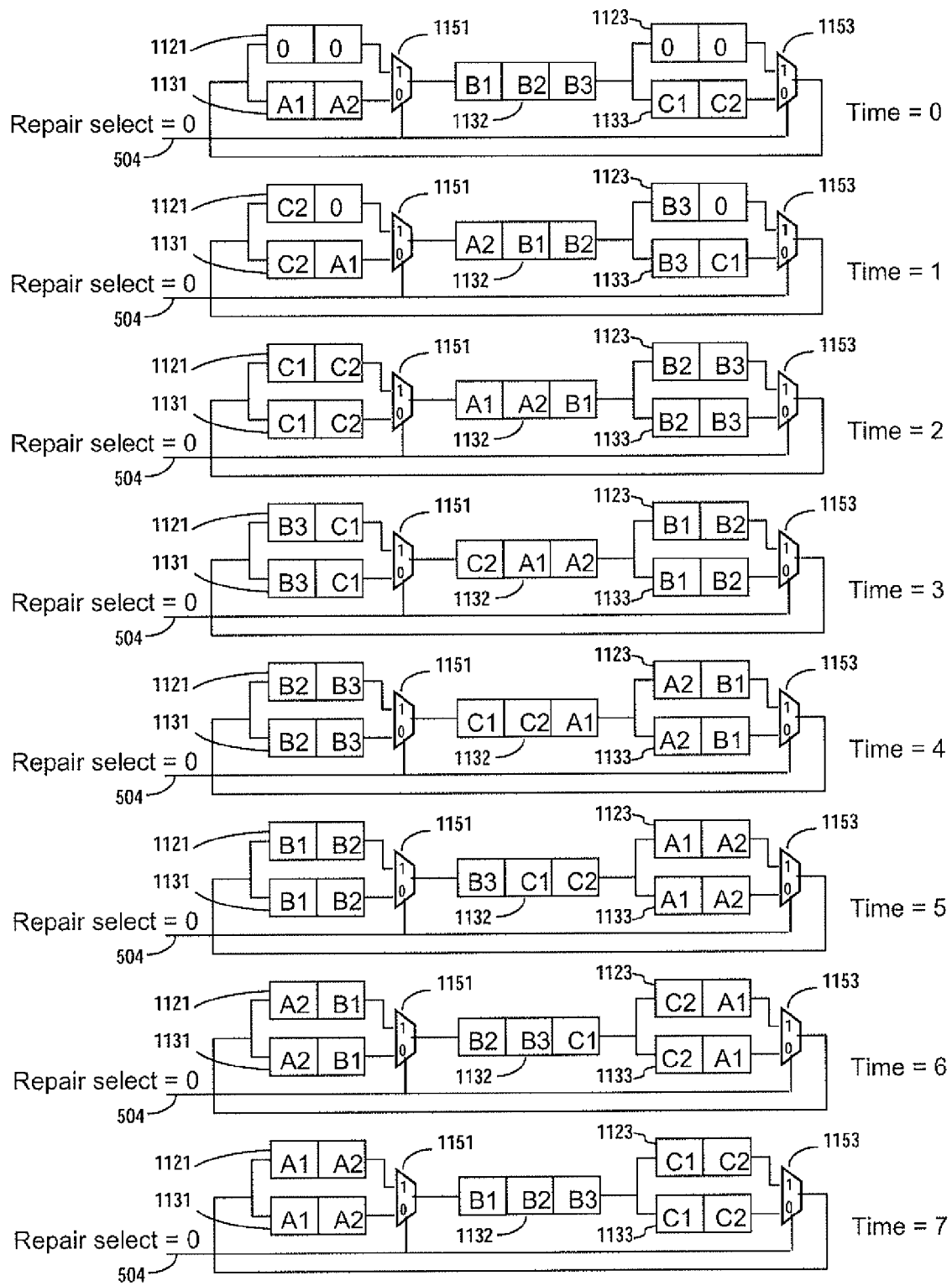
FIG. 11 is a series of simplified block diagrams of a plurality of daisy-chained BISR registers showing transfer of external BISR register contents to internal BISR registers corresponding thereto, in accordance with an embodiment of the present invention.

FIG. 11 shows the mechanism by which repair information may be transferred between external BISR registers and their associated internal BISR registers. Three external BISRs 1131-1133 are shown. External BISR 1132 is 3 bits wide and is associated with a corresponding memory (not shown) that has a parallel repair interface, while external BISRs 1131, 1133 are 2 bits wide and are associated with corresponding memories (not shown) that have a serial repair interface, with a corresponding internal BISR 1121, 1123, resulting in a daisy chain length of 7. The fuse box controller 391 has been omitted for clarity. However, the connection from the serial output of multiplexer 1153 to the serial input of internal BISR 1121 and external BISR 1131 is done inside the fuse box module 390. The serial outputs of the external BISRs 1131, 1133 and their corresponding internal BISRs 1121, 1123 each feed into a corresponding multiplexer 1151, 1153, the output of which is controlled by the Repair Select 504 signal. The first bit of each serial BISR 1121, 1131 is commonly fed with the same value, as is the first bit of serial BISR, 1123, 1133.

A symbolic label has been assigned to each bit in the serial stream for ease of visualization only.

As can be seen, by selecting the output of the multiplexers 1151, 1153 to output the data presented at its input by the corresponding external BISR 1131, 1133, after a number of shifts equal to the length of the daisy chain, the contents of the external BISRs 1131, 1133 are copied into their corresponding internal BISRs 1121, 1123, without altering the contents of the external BISR 1132 having a parallel repair interface.

The present invention can be implemented in digital electronic circuitry, or in computer hardware, firmware, software, or in combination thereof. Apparatus of the invention can be implemented in a computer program product tangibly embodied in a machine-readable storage device for execution by a programmable processor; and methods actions can be performed by a programmable processor executing a program of instructions to perform functions of the invention by operating on input data and generating output. The invention can be implemented advantageously on a programmable system including at least one input device, and at least one output device. Each computer program can be implemented in a high-level procedural or object-oriented programming language or in assembly or machine language, if desired; and in any case, the language can be a compiled or interpreted language.

Suitable processors include, by way of example, both general and specific microprocessors. Generally, a processor will receive instructions and data from a read-only memory and/or a random access memory. Generally, a computer will include one or more mass storage devices for storing data file; such devices include magnetic disks and cards, such as internal hard disks, and removable disks and cards; magneto-optical disks; and optical disks. Storage devices suitable for tangibly embodying computer program instructions and data include all forms of volatile and non-volatile memory, including by way of example semiconductor memory devices, such as EPROM, EEPROM, and flash memory devices; magnetic disks such as internal hard disks and removable disks; magneto-optical disks; CD-ROM and DVD-ROM disks; and buffer circuits such as latches and/or flip flops. Any of the foregoing can be supplemented by, or incorporated in ASICs (application-specific integrated circuits), FPGAs (field-programmable gate arrays) and/or DSPs (digital signal processors).

Examples of such types of computer are programmable processing systems contained in the fuse box controller 391, the BIST circuits 380, 381 and the BIRA modules 361-363, suitable for implementing or performing the apparatus or methods of the invention. The system may comprise a processor, a random access memory, a hard drive controller, and/or an input/output controller, coupled by a processor bus.

It will be apparent to those having ordinary skill in this art that various modifications and variations may be made to the embodiments disclosed herein, consistent with the present invention, without departing from the spirit and scope of the present invention.

Other embodiments consistent with the present invention will become apparent from consideration of the specification and the practice of the invention disclosed herein.

Accordingly, the specification and the embodiments disclosed therein are to be considered exemplary only, with a true scope and spirit of the invention being disclosed by the following claims.

What is claimed is:

1. A system for repairing at least one embedded memory on an integrated circuit, the system comprising:
   at least one repair register external to the at least one embedded memory for storing memory repair data, each external repair register being operatively coupled with a corresponding one of the at least one embedded memory for transmitting the memory repair data to the at least one embedded memory to effect repairs of the at least one embedded memory;
   a plurality of serial links interconnecting each of the at least one external repair registers in series configuration to form a daisy chain commencing at a first end and terminating at a second end;
   a fuse box module at the first and second ends of the daisy chain for retrieving fuse data from a non-volatile memory associated with the fuse box module for determining a bit length of the daisy chain and thereafter using the bit length to control dissemination of the fuse data along the daisy chain the at least one external repair register for receiving the fuse data from along the daisy chain, for determining appropriate memory repair data and for transmitting the memory repair data to its associated memory to effect repairs of its associated memory by effecting a number of shift operations along the daisy chain equal to the bit length.

2. The system according to claim 1, the fuse box module determining the bit length of the daisy chain by counting a number of shift operations to circulate a token along the daisy chain serially through each bit of each of the at least one external repair registers and back to the fuse box module.

3. The system according to claim 1, the fuse box module comprising a fuse box controller, the fuse box module for determining the bit length of the daisy chain by reading a pre-determined value embedded in the fuse box controller during design of the integrated circuit.

4. The system according to claim 1, the fuse box module for rotating data along the daisy chain by transmitting data received by the fuse box module at the second end of the daisy chain back into the daisy chain at its first end.

5. The system according to claim 4, one of the at least one embedded memories comprising a serial repair interface along which its associated external repair register may transmit memory repair data.

6. The system according to claim 5, the serial repair interface comprising an internal repair register connected within the daisy chain by serial links in parallel configuration with the memory's associated external repair register and having a bit length identical to a bit length of the memory's associated external repair register.

7. The system according to claim 6, comprising a selectably switchable multiplexer having inputs connected to serial links emanating downstream from the internal repair register and the memory's associated external repair register, and an output connected to a serial link in the daisy chain, the multiplexer being selectably switchable under control of the fuse box module.

8. The system according to claim 6, wherein data contained in a register taken from a group consisting of one of the at least one external repair registers and its corresponding internal repair register may be transferred to the other register in the group by a number of shift operations equal to the bit length of the daisy chain.

9. The system according to claim 4, the daisy chain for transmitting proposed repair data to the fuse box module for compression and storage in the non-volatile memory.

10. The system according to claim 9, the fuse box module for transmitting data received by it at the second end of the daisy chain back into the first end of the daisy chain, the fuse box controller for compressing, decompressing and bit-wise comparing fuse data with data in the daisy chain.

11. The system according to claim 4, for signaling a condition selected from a group consisting of an irreparable memory and absence of any memory errors by forcing a unique data pattern along the daisy chain.

12. The system according to claim 1, one of the at least one embedded memories comprising a parallel repair interface along which its associated external repair register may transmit memory repair data.

13. The system according to claim 1, one of the at least one external repair registers having a repair analysis circuit operatively coupled thereto.

14. The system according to claim 13, the repair analysis circuit for transmitting proposed repair data to its associated external repair register along a parallel repair analysis interface.

15. The system according to claim 14, one of the at least one external repair registers for holding its current state when another one of the at least one external repair registers is receiving repair data from an associated repair analysis circuit along a parallel repair interface between the another one of the at least one external repair register and the repair analysis circuit and no data is being circulated along the daisy chain.

16. The system according to claim 1, further comprising a test access port operatively coupled to the fuse box module for forwarding communications between the fuse box module and an off-chip tester.

17. The system according to claim 1, the fuse box module comprising a fuse box controller, a fuse box comprising the non-volatile memory and an interface between the fuse box and fuse box controller, the interface standardized at an end proximate to the fuse box controller, the fuse data in the fuse box being individually addressable by the fuse box controller absent any knowledge of a configuration of the fuse box.

18. The system according to claim 17, the fuse box controller for storing the fuse data in compressed form in the fuse box and for decompressing the fuse data prior to disseminating it along the daisy chain to the at least one external repair register.

19. The system according to claim 17, the interface comprising a cache for storing fuse values to be written to or read from the fuse box.

20. The system according to claim 1, one of the at least one embedded memories forming part of a pre-designed circuit block separate from the fuse box module, the pre-designed circuit block further comprising an external repair register associated with the at least one embedded memory and a plurality of serial links interconnecting the external repair register in series configuration with the daisy chain commencing and terminating at the fuse box module.

21. The system according to claim 20, the pre-designed circuit block comprising at least one daisy chain input and output ports for removably connecting the plurality of serial links on the pre-designed circuit block with the daisy chain commencing and terminating at the fuse box module.

22. The system according to claim 1, the non-volatile memory for storing non-memory repair data and the fuse box module for disseminating the non-memory repair data to at least one external repair register operatively coupled to both a corresponding macro module, and along the daisy chain to the fuse box module.

23. The system according to claim 22, the macro module being selected from a group consisting of an I/O pad driver, PLL and memory.

* * * * *